(12) United States Patent
Kerber et al.

(10) Patent No.: US 12,467,974 B2
(45) Date of Patent: Nov. 11, 2025

(54) DIAGNOSTIC RING OSCILLATOR CIRCUIT FOR DC AND TRANSIENT CHARACTERIZATION

(71) Applicant: Intel NDTM US LLC, Santa Clara, CA (US)

(72) Inventors: Andreas Kerber, Pleasanton, CA (US); Phillip Kliza, Palo Alto, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 0 days.

(21) Appl. No.: 18/396,111

(22) Filed: Dec. 26, 2023

(65) Prior Publication Data

US 2024/0133952 A1  Apr. 25, 2024

Related U.S. Application Data

(60) Provisional application No. 63/535,044, filed on Aug. 28, 2023.

(51) Int. Cl.

| | |
|---|---|
| G01R 31/28 | (2006.01) |
| G01R 31/26 | (2020.01) |
| G01R 31/319 | (2006.01) |
| H03K 3/03 | (2006.01) |
| H03K 3/354 | (2006.01) |
| H03K 17/687 | (2006.01) |
| H03K 19/0185 | (2006.01) |

(52) U.S. Cl.
CPC ... *G01R 31/31915* (2013.01); *G01R 31/2626* (2013.01); *G01R 31/31905* (2013.01); *H03K 3/0315* (2013.01); *H03K 3/354* (2013.01); *H03K 17/6872* (2013.01); *H03K 19/018521* (2013.01); *H03K 2217/0054* (2013.01)

(58) Field of Classification Search
CPC .......... G01R 31/3016; G01R 31/31905; G01R 31/31915; G01R 31/2626; G01R 31/2642; H03K 17/6872; H03K 2217/0054; H03K 19/018521; H03K 3/0315; H03K 3/354
See application file for complete search history.

(56) References Cited

U.S. PATENT DOCUMENTS

| | | | |
|---|---|---|---|
| 6,476,632 B1 * | 11/2002 | La Rosa ............ | G01R 31/2824 324/762.05 |
| 10,114,068 B1 * | 10/2018 | Chen ................. | G01R 31/2879 |

(Continued)

*Primary Examiner* — Thang X Le
(74) *Attorney, Agent, or Firm* — Morgan, Lewis & Bockius LLP

(57) ABSTRACT

Methods and apparatus for a diagnostic in situ ring oscillator (RO) circuit for DC and transient characterization. The RO circuit includes a plurality of symmetrical stages coupled via an RO feedback signal line and forming an inverter chain, where each stage includes a CMOS inverter comprising a pair of pMOS and nMOS transistors coupled between power-gating transistors respectively coupled to a positive voltage source and ground, wherein an output of a CMOS inverter for the stage is coupled to an input for the CMOS inverter of a next stage. The first stage is a configurable enable stage to enable the inverter chain to be set into a defined logic state, followed by multiple pre-stage-DUT stages. The output of the last stage is feed back to the input of the enable stage to form an RO feedback signal. The RO circuit can operate in multiple modes including an AC mode, a DC mode, and a hybrid mode.

20 Claims, 12 Drawing Sheets

(56) References Cited

U.S. PATENT DOCUMENTS

2009/0189703 A1\* 7/2009 Chuang ............... H03K 3/0315
   331/57
2011/0193586 A1\* 8/2011 Kuo .................. G01R 31/2642
   324/762.08

\* cited by examiner

| | RO Stress dynamic | RO Stress static | RO Sense | NFET sense | PFET sense |
|---|---|---|---|---|---|
| V+ | Vstress | Vstress | VDDnom | VDDnom | VDDnom |
| GND | GND | GND | GND | GND | GND |
| RO control | Vstress | Vstress | VDDnom | GND | GND |
| RO not control | GND | GND | GND | VDDnom | VDDnom |
| DUT header | GND | GND | VDDnom | VDDnom | GND |
| DUT footer | Vstress | Vstress | VDDnom | VDDnom | GND |
| Enable RO | Vstress | GND | VDDnom | GND | GND |
| Not Enable RO | GND | Vstress | GND | VDDnom | VDDnom |
| Set static bias | na | Vstress = NBTI / nNCS<br>GND = PBTI / pNCS | na | na | na |

*Fig. 9*

DIAGNOSTIC RING OSCILLATOR CIRCUIT FOR DC AND TRANSIENT CHARACTERIZATION

CROSS-REFERENCE TO RELATED APPLICATION

This application claims the benefit of the filing date of U.S. Provisional Application No. 63/535,044, filed Aug. 28, 2023, entitled "DIAGNOSTIC RING OSCILLATOR CIRCUIT FOR DC AND TRANSIENT CHARACTERIZATION" under 35 U.S.C. § 119(e). U.S. Provisional Application No. 63,535,044 is further incorporated herein in its entirety for all purposes.

BACKGROUND INFORMATION

Manufacturers and designers of semiconductor devices desire to have the ability to quantify different aging phenomena and their interactions while measuring their effect on numerous parameters/metrics in situ. For example, quantifying key device degradation components like Negative Bias Temperature Instability (NBTI) and Channel Hot Carrier (CHC) degradation remains a critical reliability challenge not only in advanced technology nodes using metal gate/high-k (MG/HK) dielectrics but also for conventional CMOS technologies with poly-Si gates and SiO2 or SiON gate dielectrics.

Ring-oscillator (RO) circuits are used to capture the aging kinetics of digital circuits in CMOS technologies. The introduction of time-resolved RO characterization made it feasible to separate NBTI and CHC components during standard wafer level stress conditions. A reduction in measurement delay in RO circuit characterization was beneficial for decoupling the NBTI and CHC aging mechanisms which differ in voltage dependence and time evolution. This is consistent with what was previously observed for BTI characterization in discrete devices, which typically yielded reduced power law time evolution with shorter measurement delays.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 9 is a table illustrating various parameters and input used to configure a DFR RO circuit for different types of testing.

DETAILED DESCRIPTION

Figure 1:
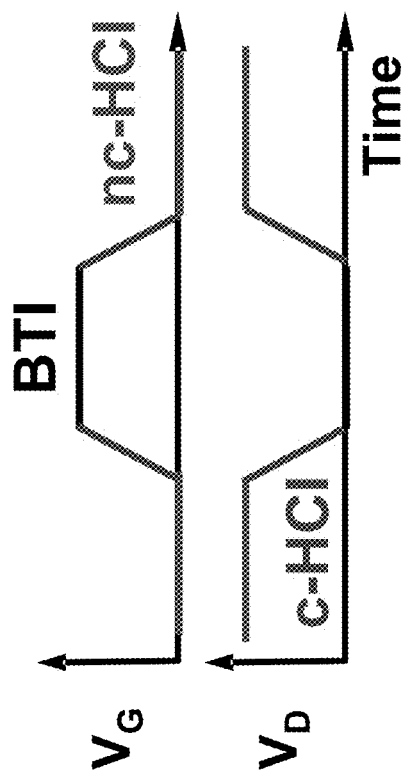
FIG. 1 is a diagram showing relevant degradation mechanisms for digital circuit aging modes.

Embodiments of methods and apparatus for diagnostic ring oscillator (RO) circuit for DC-static and transient characterization are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

For clarity, individual components in the Figures herein may also be referred to by their labels in the Figures, rather than by a particular reference number. Additionally, reference numbers referring to a particular type of component (as opposed to a particular component) may be shown with a reference number followed by "(typ)" meaning "typical." It will be understood that the configuration of these components will be typical of similar components that may exist but are not shown in the drawing Figures for simplicity and clarity or otherwise similar components that are not labeled with separate reference numbers. Conversely, "(typ)" is not to be construed as meaning the component, element, etc. is typically used for its disclosed function, implement, purpose, etc.

The relevant degradation mechanisms for digital circuit aging modes are summarized in FIG. 1, where $V_G$ is gate voltage and $V_D$ is drain voltage. During on-state pMOS devices exhibit NBTI while MG/HK nMOS devices show PBTI due to charge trapping in the HK dielectric and conventional poly-Si/SiO2 or SiON devices may also experience degradation at high stress voltages either related to Fowler-Nordheim (FN) injection or direct-tunneling (DT) currents. In the off-state, Non-Conducting Stress (NCS) aging can occur caused by hot carriers originating from either diffusion currents along the channel or band-to-band tunneling across the reversed bias drain junction. Switching between the on-state and off-state leads to CHC degradation which is typically most pronounced when the gate is biased at ~½ of the drain voltage for conventional CMOS devices with gate length ≥90 nm and when gate is approximately equal to drain for shorter gate length.

To better mimic the degradation modes in digital CMOS circuits AC stress methodologies may be used to study the recovery effects for NBTI in discrete pMOS devices (also referred to as PFETs). During AC stress the voltage levels on the gate terminal are typically altered between stress voltage and ground (GND) with drain terminal grounded while in the inverter (INV) stress mode the signal applied to the drain terminal is inverted with respect to the gate terminal.

Figure 2:
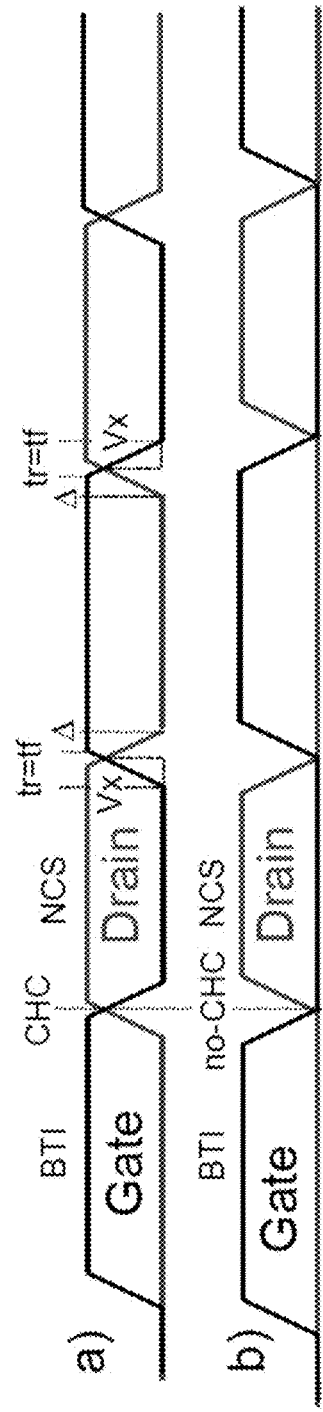
FIG. 2 is a diagram showing typical applied voltage waveforms on drain and gate terminal during AC-CHC (non-zero current crossing condition) inverter and no-CHC (zero current crossing condition) inverter stress testing.

To measure the CHC degradation of digital CMOS devices an AC-CHC methodology can be used that is based on current flow during device switching. A typical applied voltage waveform which alters the current flow on drain and gate terminals during AC-CHC stress is shown in FIG. 2 a). A digital waveform is applied to the gate and an inverted waveform to the drain of a discrete MOSFET with a specified frequency, duty cycle, rise & fall time. To modulate the CHC contribution, the gate and drain voltage signals are offset by a time Δ using synchronized remote sense amplifier units, the result of which can be seen in FIG. 2 a). The choice of Δ determines the gate and drain voltage crossover (Vx). The transition time is defined as the duration for switching the drain voltage between the stress bias and ground which for symmetric gate and drain voltage waveforms is equal to the rise ($t_r$) and fall ($t_f$) times of the digital signal. For a symmetric waveform with $t_r=t_f$ the cross-point voltage is given by, $$Vx = Vstress\left(\frac{t_r + \Delta}{2 \cdot t_r}\right) = \left(\frac{t_f + \Delta}{2 \cdot t_f}\right),$$

where Vstress is the supply voltage for CMOS circuits. For typical logic designs the crossover voltage ratio (Vx/Vstress) can range typically from −0.7 to 0.85 and is determined by the strength of the devices and the load capacitance.

A second inverter waveform is considered (see FIG. 2 b) where the crossover voltage ratio is 0 (non-overlapping) which means there is no channel current flowing while transitioning from the on-state to the off-state and vice versa, eliminating CHC degradation and is referred to as no-CHC inverter stress. Comparing AC-CHC inverter stress results with a Vx/Vstress=0.8 and no-CHC with a Vx/Vstress=0 versus the DC mid-Vg CHC stress provides valuable insights into the individual aging components under digital operation condition.

Figure 3:
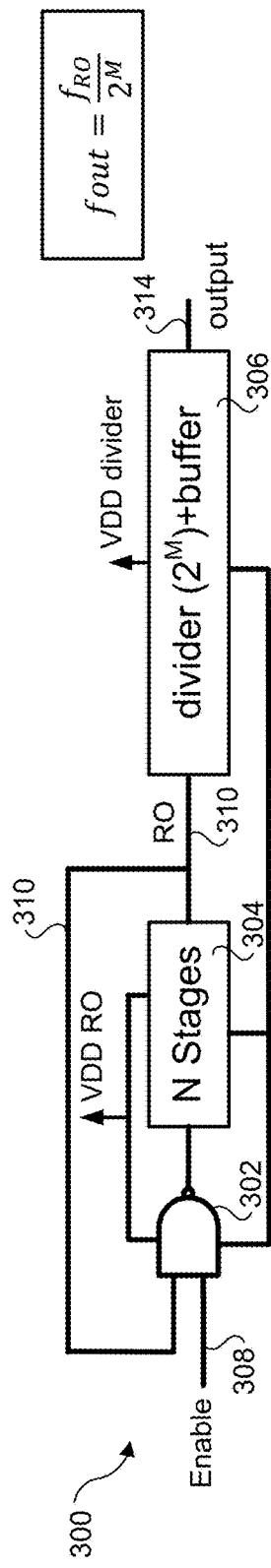
FIG. 3 shows an example of a RO test configuration for testing thin oxide CMOS devices.

FIG. 3 shows a high-level view of a conventional RO design 300. The block-level components include a NAND gate 302, N stages 304 and a divider and buffer 306. The inputs to NAND gate 302 include an enable signal 308 and an RO feedback signal 310. A high-side supply voltage VDD RO is provided to NAND gate 302 and each of N stages 304 while a separate high-side supply voltage VDD divider is provided to divider and buffer 306. The low side supply voltage of NAND gate 302, each of N stages 304, and divider and buffer 306 are tied to ground 312. The input of divider and buffer 306 can be the RO feedback signal 310, which has its frequency divided by $2^M$ to produce the output signal 314 used to measure the RO frequency.

RO design 300 includes an even number of inverting stages plus an enable NAND gate for an odd number of total stages. The enable gate is set to '0' for static DC-Static and AC-Open Loop and to '1' for dynamic AC-Closed Loop operation.

Figure 4:
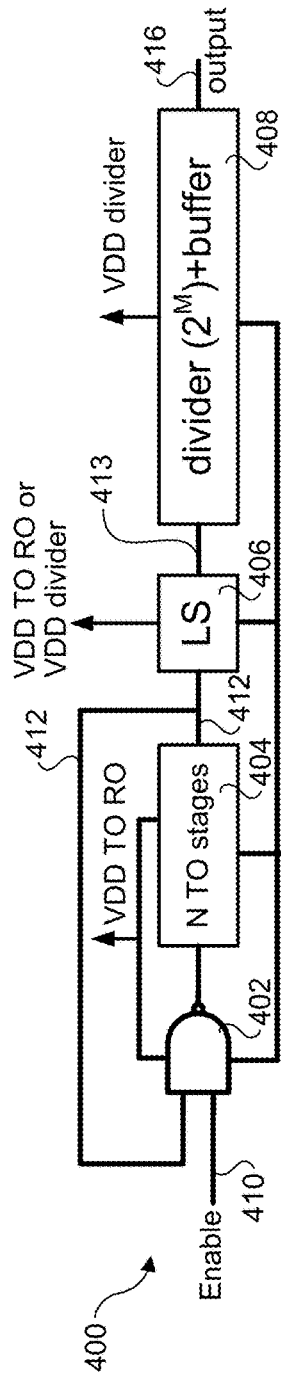
FIG. 4 shows an example of a RO test configuration for testing thick oxide CMOS devices.

FIG. 4 shows a high-level view of a thick oxide (TO) RO design 400. The block-level components include a NAND gate 402, N TO stages 404, a Level Shifter (LS) 406 and a divider and buffer 408. The inputs to NAND gate 402 include an enable signal 410 and an RO feedback signal 412. A high-side supply voltage VDD TO RO is provided to NAND gate 402 and each of N TO stages 404 while a high-side supply voltage VDD divider is provided to divider and buffer 408 consistent with the voltage specifications for thin oxide devices. Either VDD TO RO or VDD divider is provided as the high side supply voltage to LS 406. The low side supply voltage of NAND gate 402, each of N TO stages 404, LS 406, and divider and buffer 408 are tied to ground 414.

As the divider and output buffer stage are typically designed for thin oxide devices, LS 406 is inserted between the output of N TO stages 404 and divider and buffer 408 to prevent TDDB failure of the divider input stage. The level-shifted RO feedback signal 413 has its frequency divided by $2^M$ by divider and buffer 408, which outputs a signal 416 that is used to measure the divided TO RO frequency.

Figure 6:
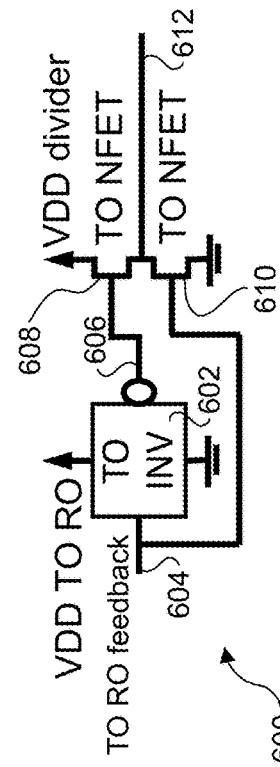
FIGS. 5 and 6 illustrate example circuits for the level shifter (LS) used in the RO test configuration of FIG. 4.
Figure 5:
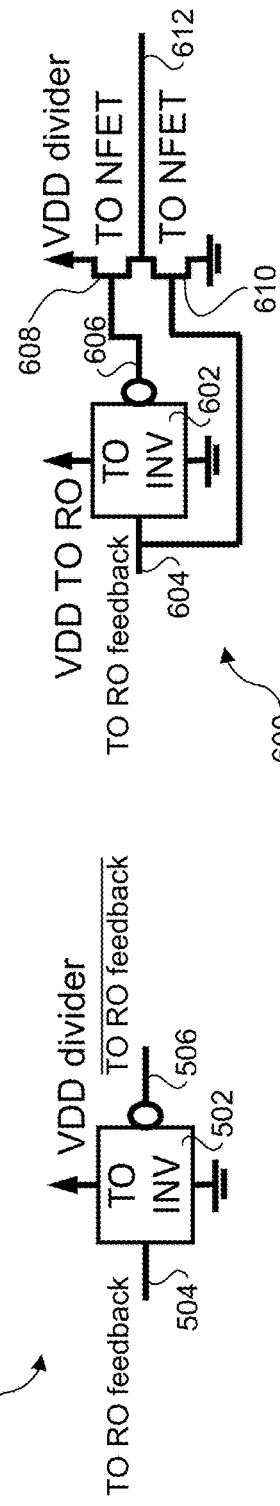

FIGS. 5 and 6 show examples of two basic level shifter circuits 500 and 600. Level shifter circuit 500 includes a thick oxide inverter 502 that is coupled between the VDD divider voltage used for thin oxide devices and ground. TO inverter 502 inverts a TO RO feedback signal 504 and outputs an inverted TO RO feedback signal 506. Level shifter circuit 600 includes a TO inverter 602 supplied with VDD TO RO that inverts a TO RO feedback signal 604 and outputs an inverted TO RO feedback signal 606 that is coupled to the gate of a TO NFET 608 (e.g., a TO nMOS transistor). A VDD divider voltage is coupled to the source of TO NFET 608, while the drain of TO NFET 608 is coupled to the source of a TO NFET 610, whose drain is coupled to ground. TO RO feedback signal 604 is coupled to the gate of TO NFET 610. Level shifter circuit 600 generates an output 612, which is coupled between the drain of TO NFET 608 and the source of TO NFET 610.

RO's may be used to study aging of digital CMOS circuits, as testing only requires either a frequency counter or digital oscilloscope to implement with standard parametric test equipment. Under the embodiments herein the design for a Design-For-Reliability (DFR) RO is optimized to enable dynamic and static aging where in static mode the stage for device characterization can be put in either NBTI/nMOS NCS or PBTI/pMOS NCS stress mode. Due to the heavy internal capacitance of large pass-gates the oscillator frequencies are ~100 MHz at the reference voltage of 1.2V for thin oxide and 2.5V for thick oxide RO's. An embodiment of the optimized DFR RO implementation is illustrated in FIGS. 7, 7a, 7b, and 7c. This design allows for static NBTI/PBTI characterization and frequency readouts in a single design that follows the bias configuration summarized in table 900 of FIG. 9 below. Basically, the conventional NAND enable stage is replaced by an inverter with stacked power-gating transistors. The pass-gates of this stage allow setting the static inverter chain into a defined logic state. The RO high side supply voltage (VDD) and low side supply voltage/ground (GND), six control terminals (header, footer, two control, two enable) and external static bias, the supply terminal of the peripheral divider/buffer circuits, and frequency output terminal require up to 10 independent Source-Measurement-Unit (SMU) terminals and one oscilloscope channel. To simplify the test code the standard stress and single-spot-sense method may be adopted, thus either frequency or nMOS on-current or pMOS on-current are measured with a sense duration of approximately 2 ms to minimize recovery effects.

Figure 7:
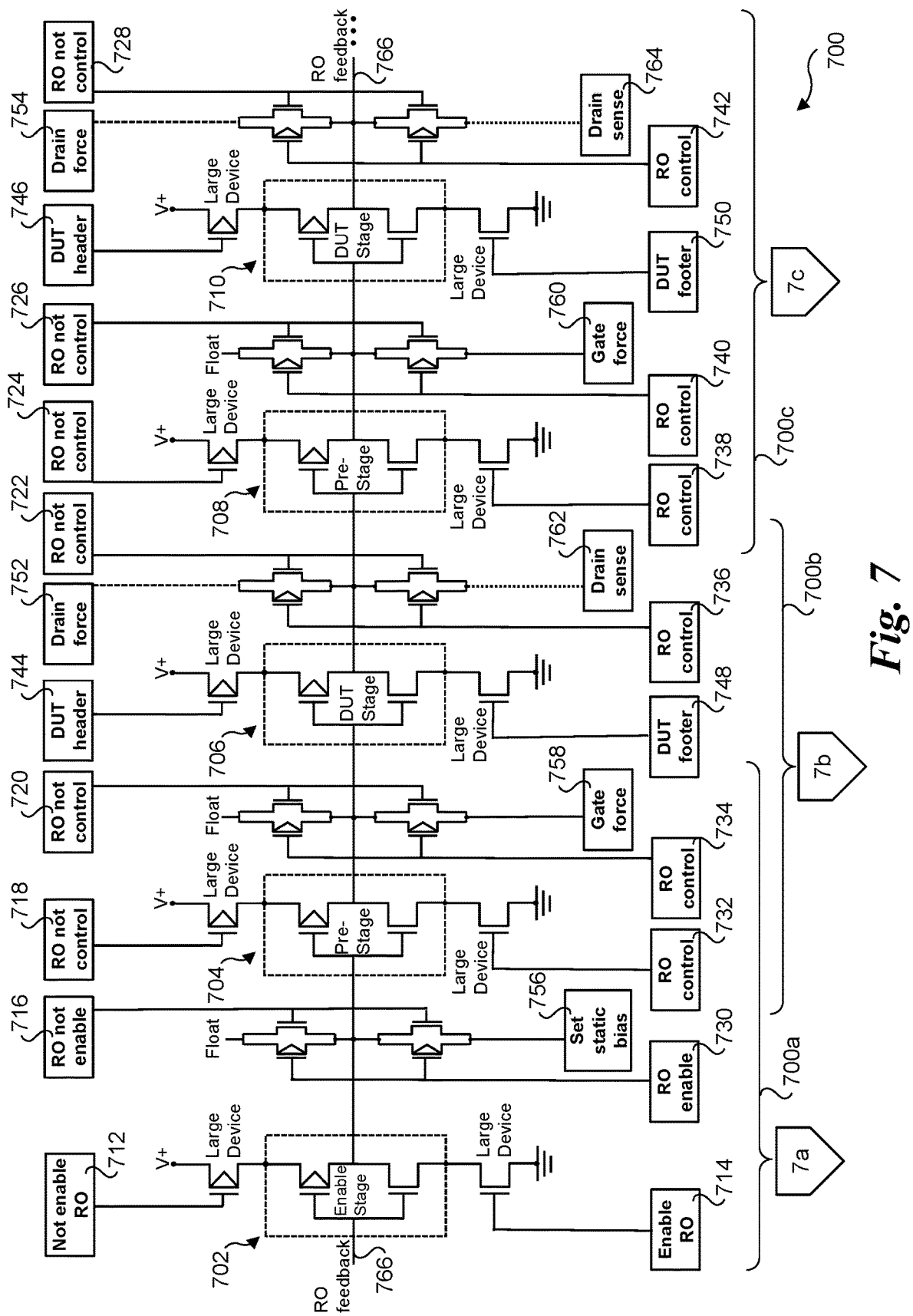
FIG. 7 shows a first example of a DFR RO circuit, according to one embodiment.
Figure 7A:
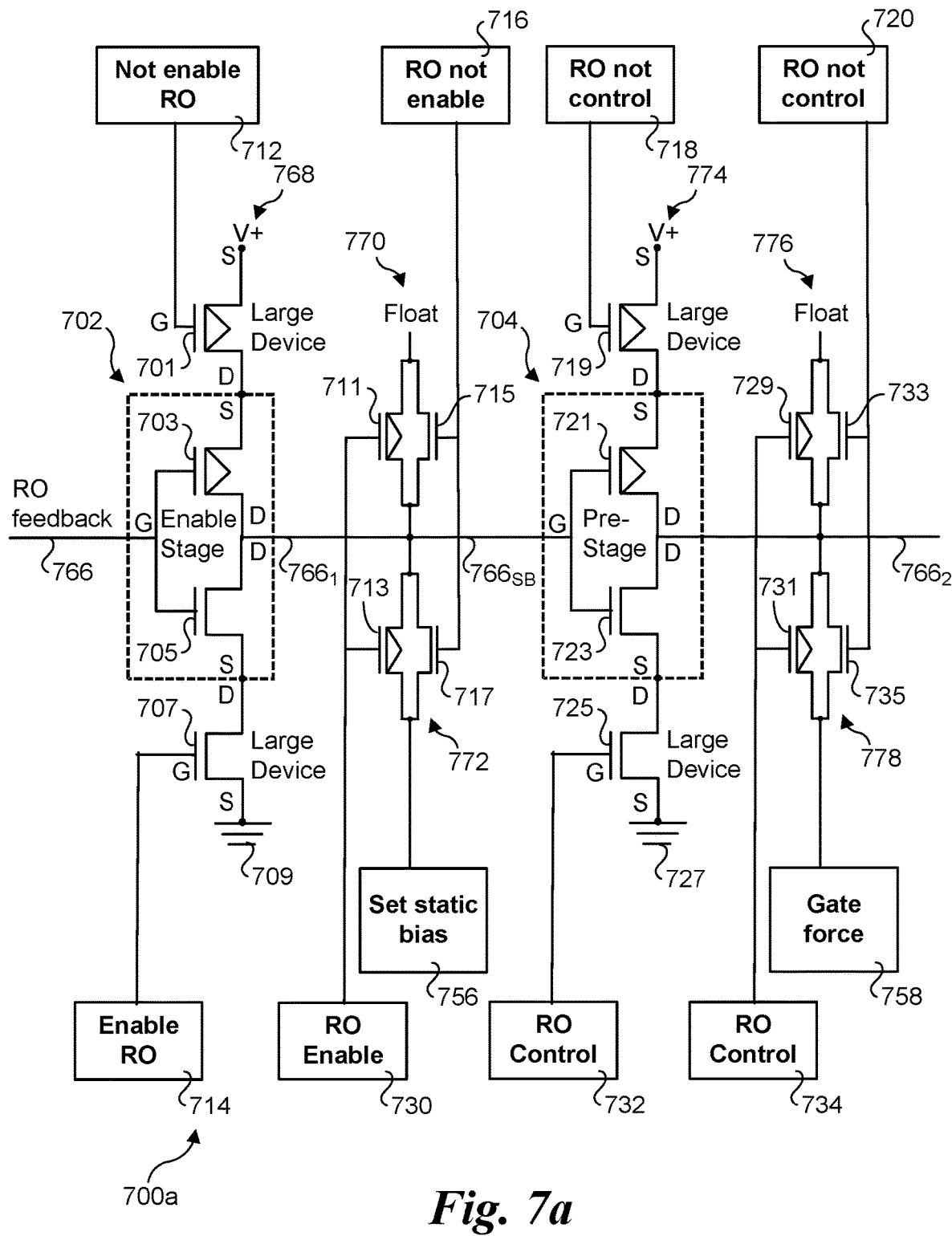
FIGS. 7*a*, 7*b*, and 7*c* show further details of the DFR RO circuit of FIG. 7.
Figure 7B:
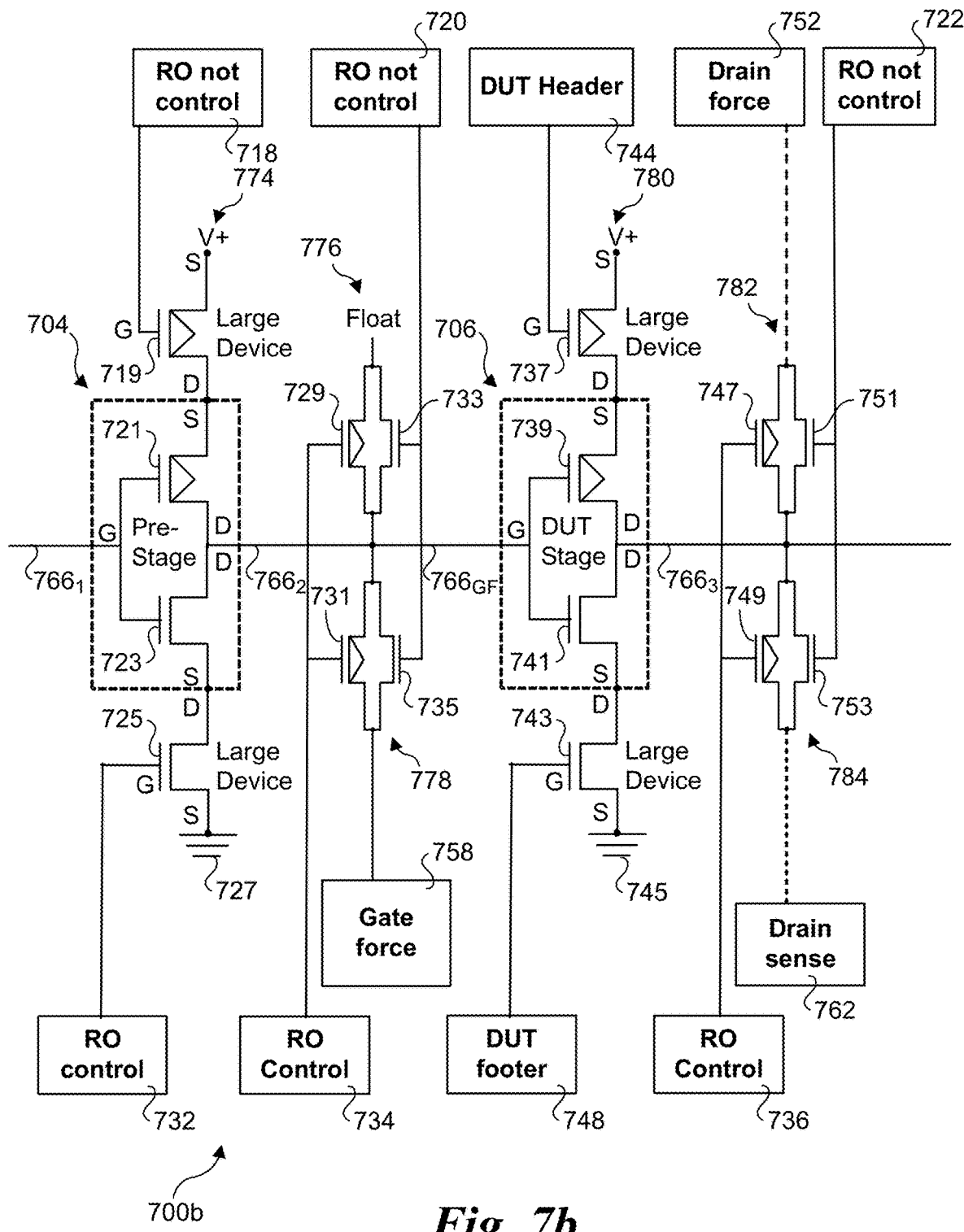
Figure 7C:
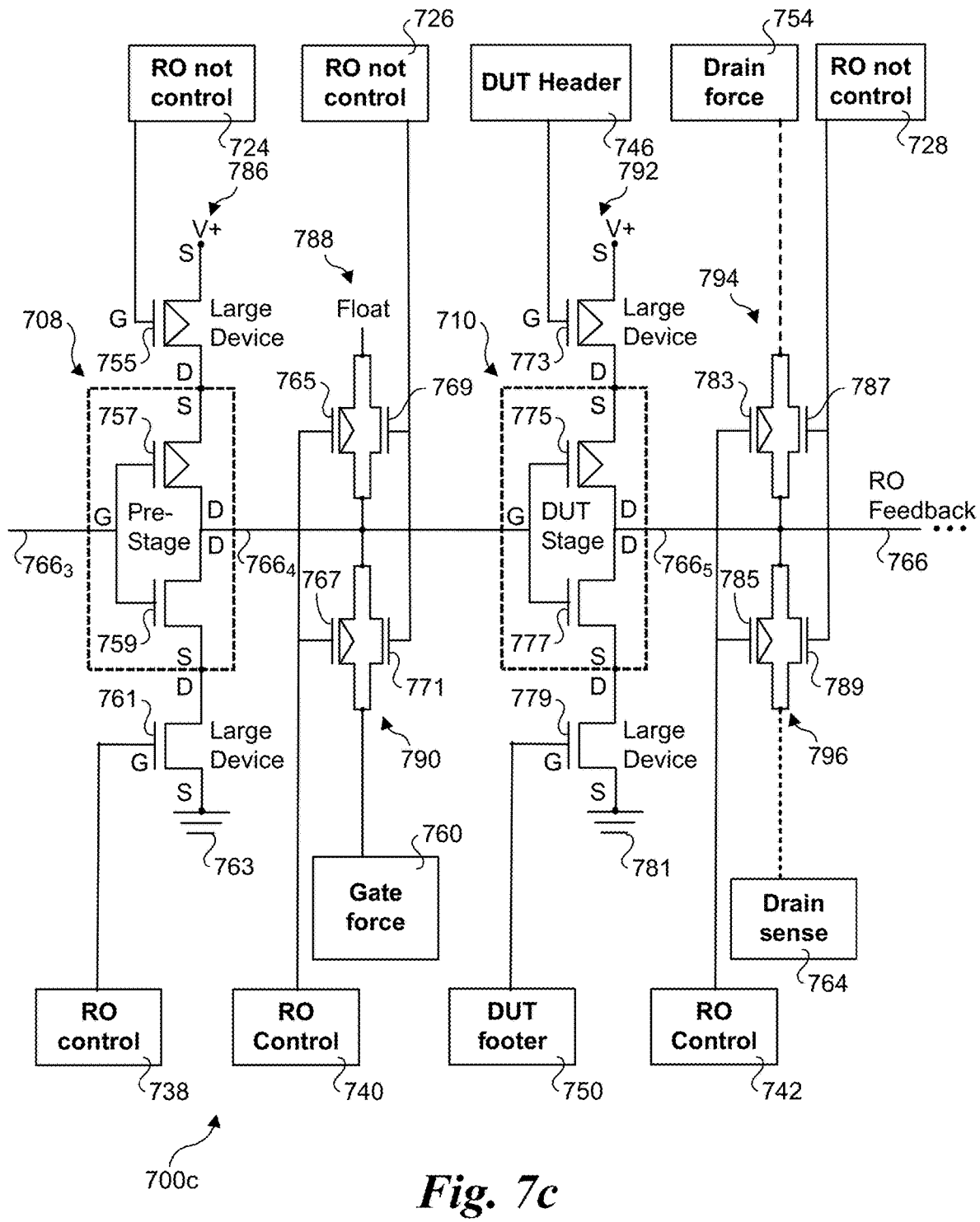

FIG. 7 shows an optimized design for a DFR-RO circuit 700 comprising symmetric stages forming an inverter chain and employing header and footer devices and pass gates, with further details of stages and associated circuitry shown in FIGS. 7a, 7b, and 7c. As illustrated, various inputs may be enabled or disabled (not enabled) for different tests and/or at different stages, including RO and RO not control. DFR-RO circuit 700 further provides inputs for a DUT (Device Under Test) header and footer, along with pass gates that facilitate drain force inputs and measurement of drain sense signals. Additionally, NBTI/PBTI stress modes may be enabled through an enhanced enable circuit with external static bias option.

DFR RO circuit 700 includes an enable stage 702 followed in order by a pre-stage 704, a DUT stage 706, a pre-stage 708, and a DUT stage 710. Various control terminals provide control inputs to the circuitry of DFR RO circuit 700, including a not enable RO control terminal 712, an enable RO control terminal 724, an RO not enable control terminal 716, RO not control terminals 718, 720, 722, 724, and 728, an RO enable terminal 730, and RO control terminals 732, 734, 736, 738, 740, and 742. Other inputs are provided by DUT header terminals 744 and 746, DUT footer terminals 748 and 750, drain force inputs 752 and 754, a set static bias input 756, and gate force inputs 758 and 760. DFR RO circuit 700 also includes drain senses 762 and 764. An RO feedback signal 766 is operatively coupled to and passes through each of enable stage 702, pre-stage 704, DUT stage 706, pre-stage 708, and DUT stage 710. DFR RO circuit 700 further comprises first and second instances of a pre-stage—DUT stage circuit sequence 700b and a pre-stage—DUT stage circuit sequence 700c.

FIG. 7a shows the first two stages of DFR RO circuit 700 comprising enable stage 702 and pre-stage 704. Each stage in DFR RO circuit 700 includes an inverter circuit coupled between external circuitry including a pMOS transistor comprising a first power-gating transistor coupled to a voltage source 'V+', and an nMOS transistor comprising a second power-gating transistor coupled to ground. pMOS transistors also may be referred to as PFET (P Field Effect Transistor) devices, while nMOS transistors may also be referred to as NFET (N Field Effect Transistor) devices.

The external circuitry associated with enable stage 702 includes a pMOS transistor 701 and an nMOS transistor 707 (the first and second power-gating transistors), while the internal circuitry comprising the inverter circuit includes a pMOS transistor 703 and an nMOS transistor 705. The source (S) of pMOS transistor 701 is tied to voltage source 'V+', while the drain (D) of pMOS transistor 701 is coupled to the source of pMOS transistor 703. As shown in Table 900 of FIG. 9 below, the voltage level of voltage source V+ illustrated in the Figures herein can vary depending on the type of stress test being performed and/or the purpose of the circuitry to which V+ is used. The drain of pMOS transistor 703 is coupled to the drain of nMOS transistor 705 and the source of nMOS transistor 705 is coupled to the drain of nMOS transistor 707, whose source is tied to ground 709. Not enable RO terminal 712 is tied to the gate (G) of pMOS transistor 701 while enable RO terminal 714 is tied to the gate of nMOS transistor 707. Meanwhile, the gates of pMOS transistor 703 and nMOS transistor 705 are tied to RO feedback signal 766 on the input side of the inverter stage. The output of the inverter stage is coupled to the drains of pMOS transistor 703 and nMOS transistor 705.

During operation, the output of Not enable RO terminal 712 and enable RO terminal 714 will be selectively set or not set to affect a desired test configuration for the DFR RO. For example, during AC-Closed Loop RO operation the enable RO terminal is set to a logic "1" while the Not enable RO terminal to a logic "0" connecting the enable stage to power and ground thus enabling oscillations as the feedback loop is closed. In the DC-Static and AC-Open Loop RO operation mode the enable RO terminal is set to a logic "0" while the Not enable RO terminal to a logic "1" disconnecting the enable stage from power and ground and forcing the inverter chain into a logic state via Set static bias terminal 756 through the passgates controlled via RO enable 730 and RO not enable 716. pMOS transistor 701 and nMOS transistor 707 are labeled "Large Device" to indicate these pMOS and nMOS power-gating transistors are much larger and wider than internal pMOS transistor 703 and nMOS transistor 705. Preferably, pMOS transistor 701 and nMOS transistor 707 should be selected such that there is minimal voltage drop across these external power-gating devices.

Enable stage 702 operates as follows. The voltages at the header and footer control terminals are either ground (logic "0" or OFF) or a positive voltage that exceeds the gate threshold voltage of the nMOS devices (logic "1" or ON) and for pmos devices either the high side of the supply voltage (logic "0") or a positive voltage that is lower by the threshold voltage of the pmos devices (logic "1"). If not enable RO terminal 712 is set and enable RO terminal 714 is not set, the gate for pMOS transistor 701 will be activated, permitting current to flow across the transistor while the gate for nMOS transistor 707 will not be activated, which prevents current from flowing across nMOS transistor 707. This results in the voltage of the source of pMOS transistor 703 to be at (substantially) V+(minimal voltage drop across this header device).

Now consider what happens when enable RO terminal 714 is ON and not enable RO terminal 712 is off. This activates the gate for nMOS transistor 707 while deactivating the gate for pMOS transistor 701. The result is the source of pMOS transistor 703 is left floating, while the source of nMOS transistor 705 is tied to ground 709 (effectively, since there will be minimal voltage drop across nMOS transistor 707). This couples the output of the enable stage signal $766_1$ to ground.

The next set of circuit elements comprise pass gates 770 and 772. Pass gate 770 is a dummy pass gate, while pass gate 772 is a functional pass gate; the reasons for including dummy pass gate 770 is for impedance and capacitance matching. The left-hand branches of this circuitry include pMOS transistors 711 and 713, while the right-hand branches include nMOS transistors 715 and 717. The gates of pMOS transistors 711 and 713 are tied to RO enable terminal 730, while the gates of nMOS transistors 715 and 717 are tied to RO not enable terminal 716. The input of pass gate 770 is left floating (with the result that it will be inoperative regardless of the input to the gates of pMOS transistor 711 and nMOS transistor 715), while the input of pass gate 772 is tied to set static bias 756.

By setting the logic levels of RO not enable terminal 716 and RO enable terminal 730, pass gate 772 can be activated or deactivated. Activation of pass gate 772 couples the set static bias input 756 to the output of the enable stage signal $766_1$, which enables a static bias for the output of the enable stage signal to be set using different static bias (voltage) values, as shown by signal $766_{SB}$. Setting the Set static bias level to a logic "0" defines the input of the Pre-stage and thus yields a logic "1" at the output which forces the DUT stage into a PBTI/pMOS NCS stress mode. Setting the Set static bias level to a logic "1" defines the input of the Pre-stage and thus yields a logic "0" at the output which forces the DUT stage into a NBTI/nMOS NCS stress mode. Alternating the Set static bias level between logic "0" and logic "1" enables a dynamic (AC-Open Loop) stress mode at an arbitrary frequency typically below the AC-Closed Loop self-oscillating (resonant) frequency set by the device performance and design.

Next, circuitry 774 associated with pre-stage 704 is described. This includes the pre-stage 704 inverter circuit comprising internal pMOS transistor 721 and internal nMOS transistor 723, which is coupled between external power-gating devices comprising a pMOS transistor 719 and an nMOS transistor 725, which are large devices. As before, the source of pMOS transistor 719 is coupled to V+ while the source of nMOS transistor 725 is coupled to ground 727. RO not control terminal 718 is tied to the gate of pMOS transistor 719 while RO control terminal 732 is tied to the gate of nMOS transistor 725. Meanwhile, the gates of pMOS transistor 721 and nMOS transistor 723 are tied to the output of the enable stage signal $766_1$ on the input side of the inverter for pre-stage 704 and tied to the drains of pMOS transistor 721 and nMOS transistor 723 on the output side of the inverter.

The circuitry associated with pre-stage 704 may be configured by setting or not setting the logic inputs at RO not control terminal 718 and RO control terminal 722. In dynamic operation the pre-stage has the same logic functionality as the DUT stage and the enable stage which is to invert the logic signal. In the static or hybrid (DC-Static or AC-Open Loop) stress the functionality of the pre-stage is also to invert the logic signal in the inverter chain set by the Set static bias terminal 756. In the characterization mode the logic levels for RO control and RO not control disconnect the pre-stage from power and ground thus avoid the loading of the input terminal of the DUT stage.

The last set of circuitry in FIG. 7a includes a dummy pass gate 776 and a functional pass gate 778. The left-hand branches of this circuitry include pMOS transistors 729 and 731, while the right-hand branches include nMOS transistors 733 and 735. The input of pass gate 776 is floating, while gate force 758 is coupled to the input of pass gate 778. The gates of pMOS transistors 729 and 731 are tied to RO control terminal 734, while the gates of nMOS transistors 733 and 735 are tied to RO not control terminal 720.

FIG. 7b shows the first pre-stage-DUT stage inverter sub-chain 700b, which can be serially replicated in a DFR RO. The first two sets of circuit elements in FIG. 7b are the second pre-stage circuit elements (associated with pre-stage 704) in FIG. 7a discussed above. Circuity 780 associated with DUT stage 706 includes the DUT stage 706 inverter circuit comprising internal pMOS transistor 739 and internal nMOS transistor 741, which is coupled between external power-gating devices comprising a pMOS transistor 737 and an nMOS transistor 743, which are large devices. As before, the source of pMOS transistor 737 is coupled to V+ while the source of nMOS transistor 743 is coupled to ground 745. DUT header terminal 744 is tied to the gate of pMOS transistor 737 while DUT footer terminal 748 is tied to the gate of nMOS transistor 743. Meanwhile, the gates of pMOS transistor 739 and nMOS transistor 741 are tied to the output of the pre-stage signal $766_2$ on the input side of the inverter for DUT stage 706 and tied to the drains of pMOS transistor 739 and nMOS transistor 741 on the output side of the inverter.

The last set of circuitry in FIG. 7b includes pass gates 782 and 778. The left-hand branches of this circuitry include pMOS transistors 747 and 749, while the right-hand branches include nMOS transistors 751 and 753. The input of pass gate 776 is tied to drain force 752, while the output of pass gate 784 is tied to drain sense 762. The gates of pMOS transistors 747 and 749 are tied to RO control terminal 736, while the gates of nMOS transistors 751 and 753 are tied to RO not control terminal 722.

The outputs of RO control terminal 734 and RO not control terminal 720 can be ON (or OFF) to selectively activate pass gate 778. Activation of pass gate 778 enables a gate force input to be provided at the input side of the inverter for DUT stage 706, as depicted by signal $766_{GF}$. Similarly, the outputs of RO control terminal 736 and RO not control terminal 752 can be ON (or OFF) to selectively activate pass gates 782 and 784. Activation of pass gate 782 enables a drain force input to be coupled to the output of the DUT stage signal $766_3$. Activation of pass gate 784 enables the output of the DUT stage signal $766_3$ to be sensed at drain sense 762. As the output currents of the inverter are much larger than the input currents, a force/sense configuration is used to reduce voltage droop in the pass gates and thus yield more accurate nmos and pmos device characteristics.

DUT header 744 and DUT footer 748 are used to control whether current flows across pMOS transistor 737 and nMOS transistor 743. The separate control of DUT header and footer devices provides the opportunity to measure nmos and pmos transistor characteristics separately as only one of them will be connected to either power or ground at a time.

FIG. 7c shows the second instance of the pre-stage-DUT stage inverter sub-chain 700c. The circuit elements and configuration of pre-stage-DUT stage inverter sub-chains 700b and 700c are similar. Circuitry 786 associated with pre-stage 708 includes the pre-stage 708 inverter circuit comprising internal pMOS transistor 757 and internal nMOS transistor 759, which is coupled between external power-gating devices comprising a pMOS transistor 755 and an nMOS transistor 761, which are large devices. The source of pMOS transistor 755 is coupled to V+ while the source of nMOS transistor 761 is coupled to ground 763. RO not control terminal 724 is tied to the gate of pMOS transistor 755 while RO control terminal 738 is tied to the gate of nMOS transistor 761. Meanwhile, the gates of pMOS transistor 757 and nMOS transistor 759 are tied to the output of the DUT stage signal $766_3$ on the input side of the inverter for pre-stage 708 and tied to the drains of pMOS transistor 757 and nMOS transistor 759 on the output side of the inverter.

The next circuit elements include a dummy pass gate 788 and a (functional) pass-gate 790. The left-hand branches of this circuitry include pMOS transistors 765 and 767, while the right-hand branches include nMOS transistors 769 and 771. The input of dummy pass gate 788 is floating, while gate force 760 is coupled to the input of pass gate 790. The gates of pMOS transistors 765 and 767 are tied to RO control terminal 740, while the gates of nMOS transistors 769 and 771 are tied to RO not control terminal 726. As before, selective activation of pass gate 790 enabled a gate force from gate force 760 to be coupled with the output of the pre-stage signal $766_4$ prior to the input of the inverter for stage 710.

Circuity 792 associated with DUT stage 710 includes the DUT stage 710 inverter circuit comprising internal pMOS transistor 775 and internal nMOS transistor 777, which is coupled between external power-gating devices comprising a pMOS transistor 773 and an nMOS transistor 779, which are large devices. As before, the source of pMOS transistor 773 is coupled to V+ while the source of nMOS transistor 779 is coupled to ground 781. DUT header terminal 746 is tied to the gate of pMOS transistor 773 while DUT footer terminal 750 is tied to the gate of nMOS transistor 779. Meanwhile, the gates of pMOS transistor 775 and nMOS transistor 777 are tied to the output of the DUT stage signal $766_5$ on the input side of the invertor for DUT stage 710 and tied to the drains of pMOS transistor 775 and nMOS transistor 777 on the output side of the inverter.

The final set of circuitry in FIG. 7c includes pass gates 794 and 796. The left-hand branches of this circuitry include pMOS transistors 783 and 785, while the right-hand branches include nMOS transistors 787 and 789. The input of pass gate 794 is tied to drain force 754, while the output of pass gate 796 is tied to drain sense 764. The gates of pMOS transistors 783 and 785 are tied to RO control terminal 742, while the gates of nMOS transistors 787 and 789 are tied to RO not control terminal 728.

The outputs of RO control terminal 740 and RO not control terminal 726 can be ON (or Of) to selectively activate pass gate 790. Activation of pass gate 790 enables a gate force input to be provided at the input side of the inverter for DUT stage 710. Similarly, the outputs of RO control terminal 742 and RO not control terminal 728 can be ON (or OFF) to selectively activate pass gates 794 and 796. Activation of pass gate 794 enables a drain force input to be coupled to the output of the DUT stage signal $766_5$. Activation of pass gate 796 enables the output of the DUT stage signal $766_5$ to be sensed at drain sense 764.

Figure 8:
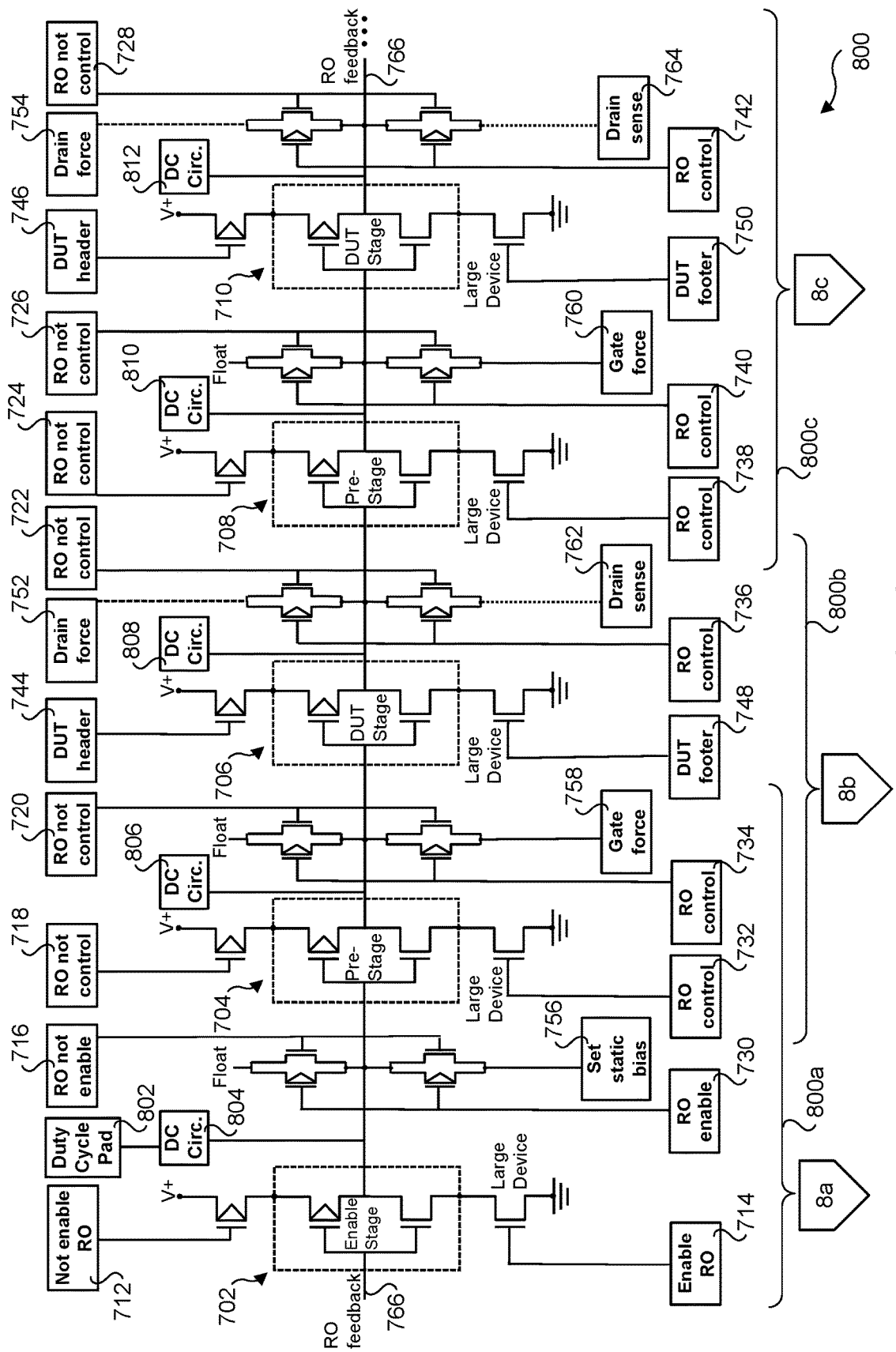
FIG. 8 shows a second example of a DFR RO circuit, according to one embodiment.
Figure 8A:
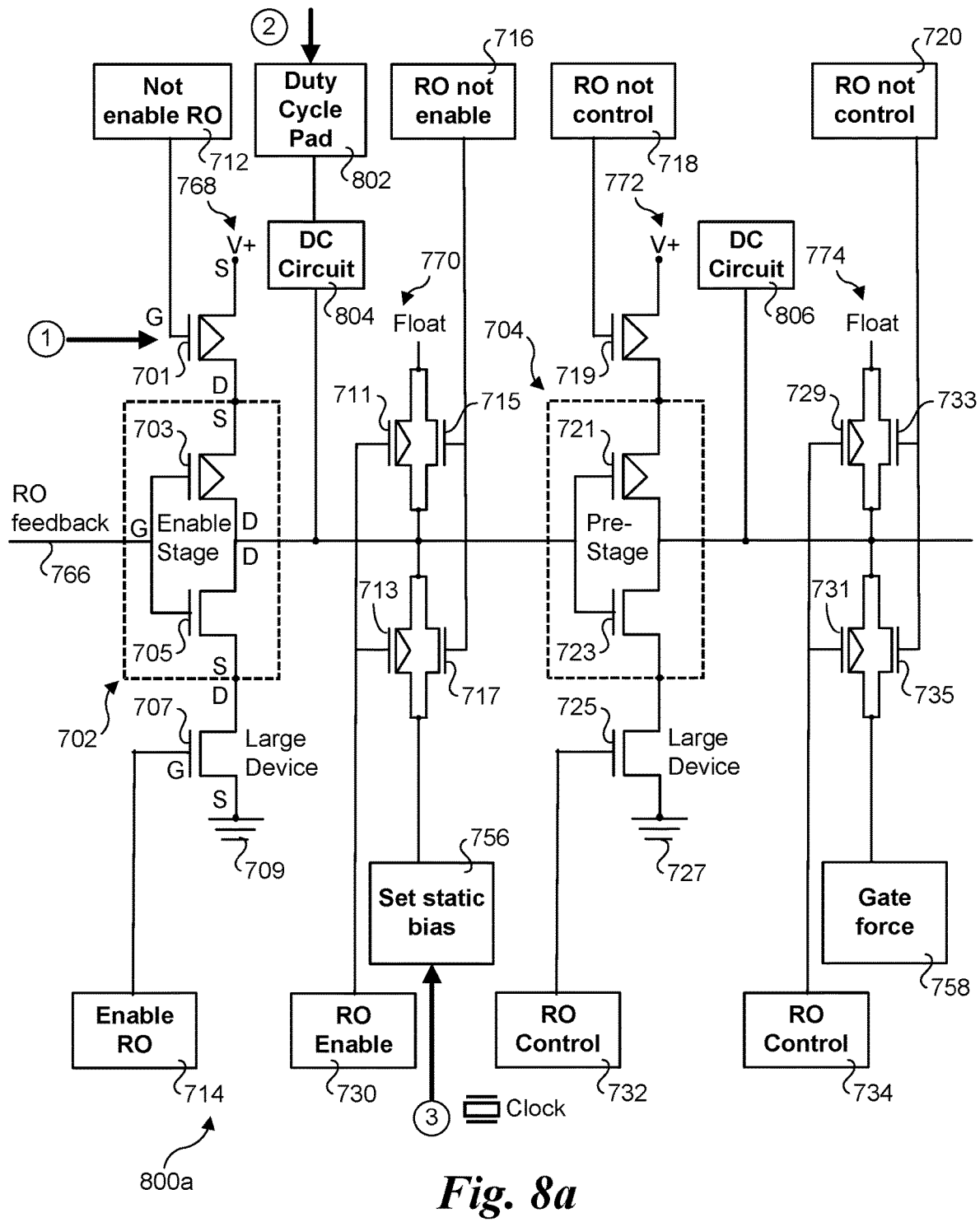
FIGS. 8*a*, 8*b*, and 8*c* show further details of the DFR RO circuit of FIG. 8.
Figure 8B:
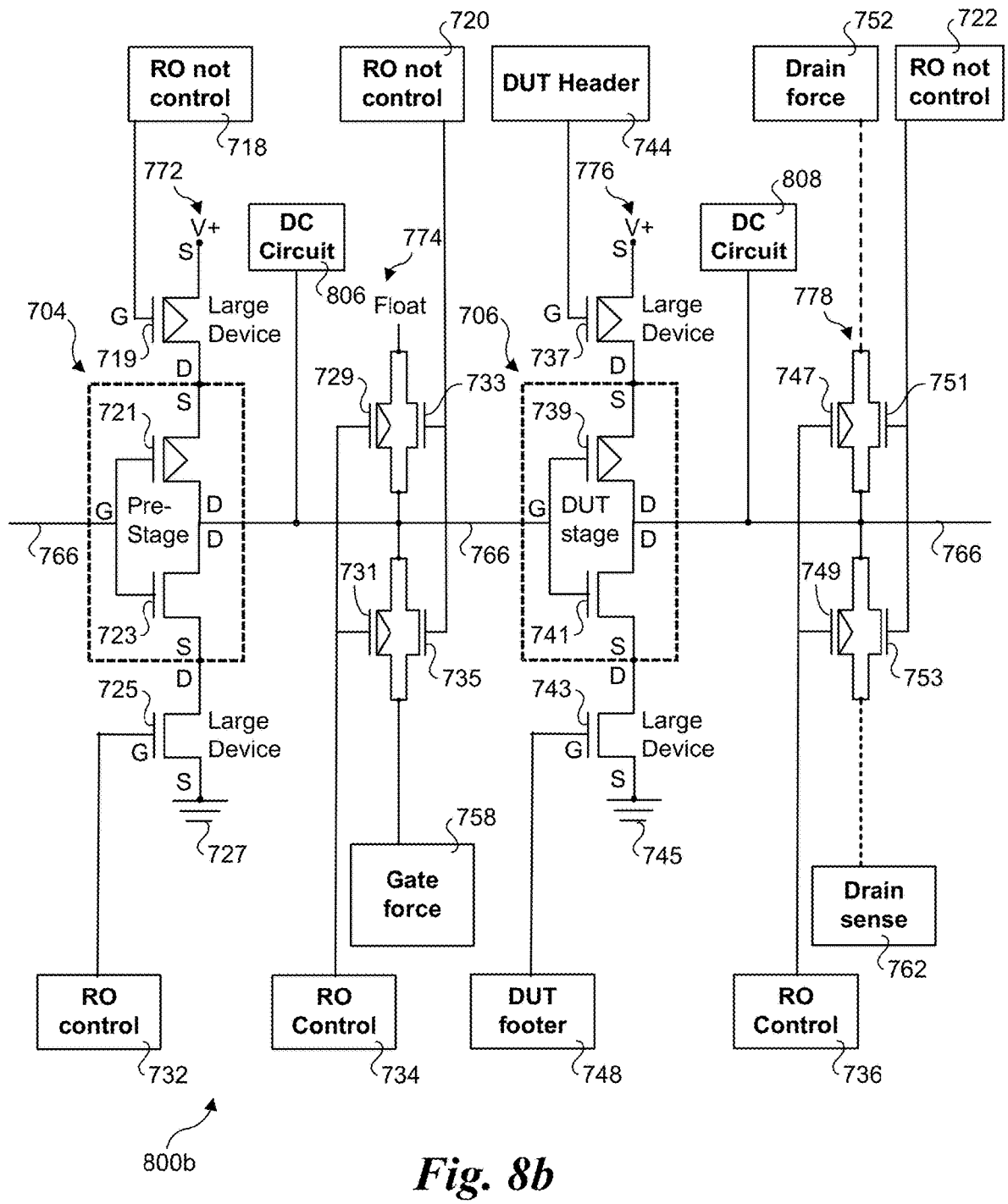
Figure 8C:
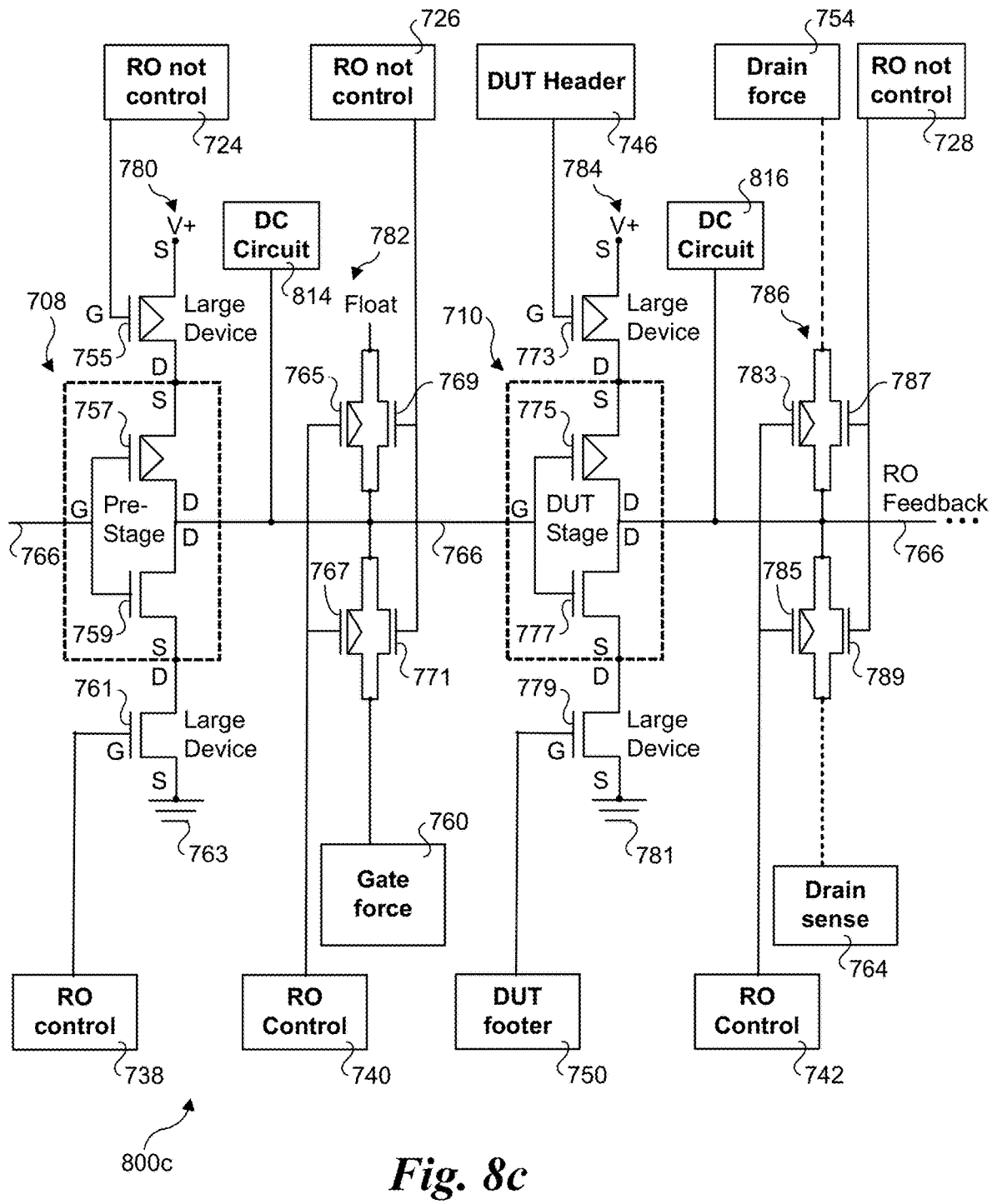

FIG. 8 shows a DFR RO circuit 800 that further adds a duty cycle pad 802 and DC (Duty Cycle, does not refer to Static in this usage of "DC") measure circuits 804, 806, 808, 810, and 812. Further details of this DFR RO circuit 800 are shown in FIGS. 8a, 8b, and 8c. FIG. 8a, which shows an inverter sub-chain 800a including enable stage and first pre-stage 800a of DFR RO circuit 800 is annotated with three qualities and functions for DFR RO circuit 800. As depicted at the arrow with an encircled '1', impedance matching is applied to all RO stages. This means, for example, the impedance of the power-gating transistors for each stage match, as do the impedance of the internal transistors that form the inverter for a given stage.

Second, as depicted by the arrow with an encircled '2', DFR RO circuit 800 is an in situ circuit that can infer the duty cycle at t=0 and after Aging. A simple implementation of a duty cycle circuit is the use of an inverter to charge/discharge an RC element (in, for example a low-pass filter configuration) where the time constant tau is set to the R×C and is set to be much larger than the period of the oscillator frequency. The Duty cycle pad voltage terminal is connected between resistor and capacitor. A 2nd implementation of a DC duty cycle circuit consists of a sub-circuit that generates matching Iup and Idown currents. The input of the DC duty cycle circuit turns on Iup when above a specific threshold voltage and turns on Idown when below a specific threshold voltage. The resultant voltage at the output of the DC duty cycle circuit reflects the amount of time the Input signal was above the threshold voltage and the amount of time below the threshold voltage. For example, if the Output voltage equals the threshold voltage it can be said that the duty cycle is 50%. If the output voltage is 10% higher than the threshold voltage, it can be said that the DC duty cycle Input signal spends 60% of its time above the threshold voltage and only 40% of its time below the threshold voltage.

Third, as depicted by the arrow with an encircled '3', an external clock 814 may be selectively used in the hybrid (DC-Static or AC-Open Loop) mode to study 0 Hz and up to frequencies close to AC-Closed Loop frequencies.

FIG. 8b shows an inverter sub-chain 800b comprising pre-stage 704 and DUT stage 706. FIG. 8c shows an inverter sub-chain 800c comprising pre-stage 708 and DUT stage 710. Each input of the DC circuits 806, 808, 810, and 812 is connected to RO feedback signal 766. While circuit details between circuits 804 circuits 806, 808, 810, and 812 may differ, input impedance and capacitance are the same to maintain impedance and capacitance matching along the chain.

DFR RO circuits 700 and 800 provide the following additional capabilities:
- The ability to quantify the effects of noise on each Aging mechanism
- The ability to quantify the effects of each Aging mechanism on frequency
- The ability to independently control the RO charge up current and charge down current Additionally, through the use of external power supplies, a dedicated RO power supply may be used for the DFO RO circuits 700 and 800, while a dedicated periphery circuit power supply may be used to power peripheral circuitry.

Generally, the pMOS and nMOS device sizes for the pMOS and nMOS transistors described above are chosen to match all the other stages of the RO. This results in the exact matching of every stage of the RO. Note that the power-gating transistors have a very large width in order to ensure as small of a voltage drop across them as possible, and to ensure the largest possible $V_{DS}$ is applied to the internal pMOS and nMOS devices. This allows for a more accurate study of the much smaller internal pMOS and nMOS devices. The power-gating pMOS and nMOS devices simply reconfigure the RO as an oscillator and alternatively act as a pathway to measure the I/V characteristics of the much smaller internal pMOS and nMOS devices before stressing (T=0) and after DC-Static, Hybrid, and AC/Dynamic/Transient stressing. The internal pMOS and nMOS devices are the subject of the aging study and not the much larger power-gating pMOS and nMOS devices. The goal of this structure is to measure the frequency change of the RO due to aging and then to break the oscillation loop and measure the I/V characteristics, and then to ultimately correlate the AC frequency degradation and the DC I/V degradation due to transistor aging. The DFR RO circuitry may be configured to study various Aging phenomena such as CHC, NBTI, PBTI, NCS, . . . as the aging phenomena applies to both the pMOS and nMOS devices. Additionally, the DFO RO circuit structure also allows the study of Aging phenomena while sweeping frequency from 0 hertz (DC) up to the 21-stage RO frequency of ~100 Mhz and then up to max frequency of a 3-stage RO (~2.5 Ghz) for a conventional CMOS process with gate lengths of approximately 100 nm.

FIG. 9 shows table 900 depicting various optimized DFR-RO stress and sense control settings that may be used with DFR-RO circuit 700, according to one embodiment. The values and/or settings for V+, RO control, RO not control, DUT header, DUT footer, Enable RO, and Not Enable RO, and Set static bias may be configured, as shown in table 900 to implemented different test modes. These include dynamic RO stress, static RO stress, RO sense, NFET (nMOS transistor) sense, and PFET (pMOS transistor sense).

RO control, RO not control, DUT header and DUT footer, enable RO and not-enable RO signal control connectivity to power/GND and pass gates to drive the NFET/PFET devices. In FET sense mode, the drain is biased via force/sense line to compensate IR drop.

Figure 10:
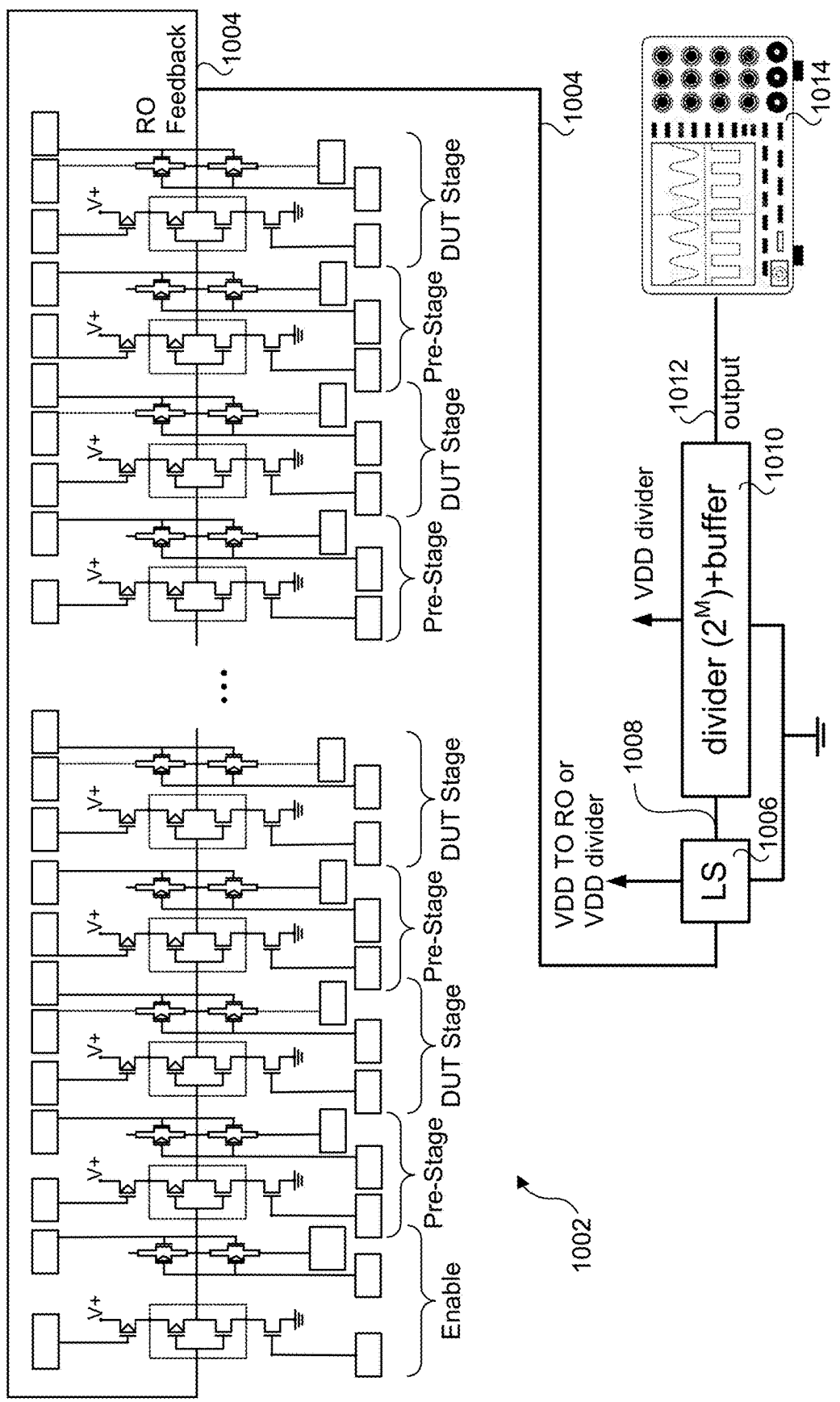
FIG. 10 shows a test configuration for performing frequency testing using a DFR RO for a CMOS device including thick oxide pMOS and nMOS transistors, according to one embodiment.

FIG. 10 shows an in situ test configuration 1000 for performing frequency testing, according to one embodiment. Generally, the DFR RO circuit 1002 may comprise N stages where N is odd. The stages will begin with an enable stage, followed by one or more pairs of pre-stage-DUT stage, as shown in FIG. 10 and illustrated above. When there is an odd number of chained invertors that are all powered (the power-gating pMOS and nMOS devices are activated), a DFR RO circuit will produce an oscillating RO feedback signal 1004. This may be used for frequency testing of the pMOS and nMOS inverter chain.

The example in situ test configuration 1000 is for thick oxide testing. As shown, RO feedback signal 1004 is passed to an LS 1006, with the level-shifted output 1008 fed into divider+buffer 1010. The divided output 1012 is then sampled with an oscilloscope 1014. SMUs (not separately shown) are used to provide the control inputs and signals to DFO RO circuit 1002 to activate the power-gating pMOS and nMOS devices and perform other configuration operations.

In summary, embodiments of the DFO RO may be configured to have the following attributes/features/capabilities/modes:

AC-Closed Loop mode:
 a. The ability to study frequency and in situ duty cycle in traditional RO transient (AC closed-loop natural frequency) operation/mode
 b. The ability to study the effects of noise (frequency and amplitude) both internally generated and externally applied
 c. The ability to study frequency domain cause and effect relationships
 d. The ability to infer the duty cycle as seen in the RO loop using the methods of:
  i. Voltage averaging
  ii. Integration of charge over time (the comparing over time of Iup and Idown) DC-Static mode:
 e. The ability to study the RO in a static (DC) mode
  i. Allows for the study of both pMOS and nMOS IV characteristics using a very low current (Sense) method to more accurately measure voltage
  ii. The ability to break the RO loop for use during DC measurements while not altering the AC matching of all RO stages Hybrid Mode:
 f. The ability to study the RO in a hybrid AC-Open Loop and DC-Static mode
  i. Allows for the study of both pMOS and nMOS zero Hz and low frequency phenomena Structural:
 g. Independent control of both the charge up and charge down current supplied to each RO stage which allows for the control of frequency and rise/fall times
 h. One power supply (vcc) dedicated to the RO and a $2^{nd}$ power supply (vccp) dedicated to the support/periphery circuitry used for measuring the RO and its constituent characteristics in the AC-Closed Loop, AC-Open Loop, DC-Static, and Hybrid modes
 i. The ability to set vcc independent of vccp which allows for;
  i. The powering down of the periphery circuitry while the RO is being operated in the traditional transient (AC-Closed-Loop) mode
  ii. Control of the voltage (threshold) at which the duty cycle is determined Although some embodiments have been described in reference to particular implementations, other implementations are possible according to some embodiments. Additionally, the arrangement and/or order of elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Additionally, "communicatively coupled" means that two or more elements that may or may not be in direct contact with each other, are enabled to communicate with each other. For example, if component A is connected to component B, which in turn is connected to component C, component A may be communicatively coupled to component C using component B as an intermediary component.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

As used herein, a list of items joined by the term "at least one of" can mean any combination of the listed terms. For example, the phrase "at least one of A, B or C" can mean A; B; C; A and B; A and C; B and C; or A, B and C.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An in situ ring oscillator (RO) circuit for capturing one or more characteristic relating to aging of CMOS circuitry in a CMOS device, comprising:
a plurality of symmetrical stages coupled via an RO feedback signal line and forming an inverter chain, the plurality of symmetrical stages including, for each stage, a CMOS inverter comprising a pair of pMOS and nMOS transistors coupled between first and second power-gating transistors respectively coupled to a positive voltage source and ground, wherein an output of the CMOS inverter for the stage is coupled to an input for the CMOS inverter of a next stage;
wherein the plurality of symmetrical stages include at least:
an enable stage configured to enable the inverter chain to be put into a defined logic state or mode;
one or more Device Under Test (DUT) stages, each having a gate of the first power-gating transistor coupled to a DUT header, and a gate of the second power-gating transistor coupled to a DUT footer; and
a pre-stage, preceding each of the one or more DUT stages.

2. The in situ RO circuit of claim 1, further comprising a plurality of header devices and footer devices coupled to the gates of the first and second power-gating transistors, wherein the plurality of header devices and footer devices enable configuration of the RO circuit to enable a dynamic aging mode and a static aging mode, and wherein in the static aging mode, a first DUT stage can be put in either Negative Bias Temperature Instability (NBTI)/nMOS Non-Conducting Stress (NCS) stress mode or Positive Bias Temperature Instability PBTI/pMOS NCS stress mode.

3. The in situ RO circuit of claim 2, wherein the first DUT stage includes a CMOS inverter circuit comprising a thin oxide pMOS transistor and a thin oxide nMOS transistor and wherein the RO circuit is configurable to perform dynamic and static RO stress testing of the thin oxide pMOS transistor and the thin oxide nMOS transistor.

4. The in situ RO circuit of claim 2, wherein the first DUT stage includes a CMOS inverter circuit comprising a thick oxide pMOS transistor and a thick oxide nMOS transistor and wherein the RO circuit is configurable to perform dynamic and static RO stress testing of the thick oxide pMOS transistor and the thick oxide nMOS transistor.

5. The in situ RO circuit of claim 1, further comprising:
a pass gate circuit coupled between a static bias device and the RO feedback signal line comprising a pMOS transistor and an nMOS transistor arranged in parallel to the PMOS transistor; and
control inputs respectively coupled to the gate of the pMOS transistor and the gate of the nMOS transistor, wherein the control inputs can be used to selectively couple the static bias device to the RO feedback signal line.

6. The in situ RO circuit of claim 1, further comprising:
a pass gate circuit coupled between a gate force device and the RO feedback signal line comprising a pMOS transistor and an nMOS transistor arranged in parallel to the PMOS transistor; and
control inputs respectively coupled to the gate of the pMOS transistor and the gate of the nMOS transistor, wherein the control inputs can be used to selectively couple the gate force device to the RO feedback signal line.

7. The in situ RO circuit of claim 1, further comprising:
a first pass gate circuit coupled between a drain force device and the RO feedback signal line comprising a first pMOS transistor and a first nMOS transistor arranged in parallel to the first PMOS transistor;
a second pass gate circuit coupled between a drain sense device and the RO feedback signal line comprising a second pMOS transistor and a second nMOS transistor arranged in parallel to the second PMOS transistor; and
control inputs respectively coupled to gates of the first and second pMOS transistors and to gates of the first and second nMOS transistors,
wherein the control inputs can be used to selectively couple the drain force device to the RO feedback signal line and to selectively couple the drain sense device to the RO feedback signal line.

8. The in situ RO circuit of claim 1, further comprising a plurality of duty cycle circuits, between each of the plurality of symmetrical stages including the RO feedback signal line, wherein the RO circuit is configurable to enable measurement of a duty cycle during stress testing of the pMOS and nMOS transistors in one or more DUT stage CMOS inverters.

9. The in situ RO circuit of claim 8, further comprising a duty cycle pad coupled to a first duty cycle circuit, wherein the first duty cycle circuit is configured to infer the duty cycle of a stage by measuring circuit output voltage.

10. The in situ RO circuit of claim 1, wherein each DUT stage is preceded by the pre-stage including a means for selectively coupling a gate force to the RO feedback signal line prior to an input of the CMOS inverter for the DUT stage.

11. A CMOS device, comprising:
CMOS circuitry configured to perform at least one function and including a plurality of pMOS and nMOS transistors; and
an in situ ring oscillator (RO) circuit, including:
a plurality of symmetrical stages coupled via an RO feedback signal line, the plurality of symmetrical stages including, for each stage, a CMOS inverter comprising a pair of pMOS and nMOS transistors coupled between first and second power-gating transistors respectively coupled to a positive voltage source and ground, wherein an output of the CMOS inverter for the stage is coupled to an input for the CMOS inverter of a next stage;
wherein the plurality of symmetrical stages include at least:
a configurable enable stage configured to enable an inverter chain to be set into a defined logic state;
one or more Device Under Test (DUT) stages, each having a gate of the first power-gating transistor coupled to a DUT header, and a gate of the second power-gating transistor coupled to a DUT footer; and
a pre-stage, preceding each of the one or more DUT stages; and
wherein the pair of pMOS and nMOS transistors in the CMOS inverter of the plurality of symmetrical stages comprise a portion of the plurality of pMOS and nMOS transistors of the CMOS circuitry.

12. The CMOS device of claim 11, further comprising a plurality of header devices and footer devices coupled to the gates of the first and second power-gating transistors, wherein the plurality of header devices and footer devices enable configuration of the RO circuit to enable a dynamic aging mode and a static aging mode, and wherein in the static aging mode a DUT stage can be put in either Negative Bias Temperature Instability (NBTI)/nMOS Non-Conducting Stress (NCS) stress mode or Positive Bias Temperature Instability PBTI/pMOS NCS stress mode.

13. The CMOS device of claim 11, further comprising:
means for configuring the RO circuit to operate in a DC-Static mode to enable measurements of pMOS and nMOS transistor I/V (current-voltage) characteristics.

14. The CMOS device of claim 11, further comprising:
means for configuring the RO circuit to operate in an AC-Closed Loop mode to enable measurement frequency and in situ duty cycle.

15. The CMOS device of claim 11, further comprising:
means for configuring the RO circuit to operate in a hybrid AC-Open Loop or DC-Static mode to enable study of pMOS and nMOS transistor zero Hz and low frequency phenomena.

16. A method for in situ testing a CMOS device comprising a plurality of pMOS and nMOS transistors, comprising:
applying control and voltage inputs to a ring oscillator (RO) circuit, having a plurality of symmetrical stages coupled via an RO feedback signal line, the plurality of symmetrical stages including, for each stage, a CMOS inverter comprising a pair of pMOS and nMOS transistors coupled between first and second power-gating transistors respectively coupled to a positive voltage source and ground, wherein an output of the CMOS inverter for the stage is coupled to an input for the CMOS inverter of a next stage, wherein the plurality of symmetrical stages further include:
an enable stage to enable an inverter chain to be set into a defined logic state or mode;
one or more Device Under Test (DUT) stages, each having a gate of the first power-gating transistor coupled to a DUT header, and a gate of the second power-gating transistor coupled to a DUT footer; and
a pre-stage, preceding each of the one or more DUT stages; and
wherein the pair of pMOS and nMOS transistors in the CMOS inverter of the plurality of symmetrical stages comprise a portion of the plurality of pMOS and nMOS transistors of the CMOS device;
configuring, via selective control inputs, a Negative Bias Temperature Instability (NBTI)/nMOS Non-Conducting Stress (NCS) stress mode; and
using at least one test instrument to take measurements of the RO feedback signal line for one or more DUT stages.

17. The method of claim 16, further comprising:
configuring, via selective control inputs, a Positive Bias Temperature Instability (PBTI)/pMOS NCS stress mode; and
using at least one test instrument to take measurements of the RO feedback signal line for one or more DUT stages.

18. The method of claim 16, further comprising:
configuring, via control inputs, the RO circuit to operate in a DC-Static mode; and
capturing I/V (current-voltage) characteristics for one or more pMOS and nMOS transistors in one or more DUT stages.

19. The method of claim 16, further comprising:
configuring, via control inputs, the RO circuit to operate in a hybrid AC-Open Loop or DC-Static mode; and
operating the RO circuit over a frequency range from 0 Hz to a maximum target open-loop frequency; and
capturing measurement for aging characterization for one or more pMOS and nMOS transistors in one or more DUT stages.

20. The method of claim 16, further comprising:
configuring, via control inputs, the RO circuit to operate in an AC-Closed Loop mode; and
coupling an RO feedback signal at an output of a last DUT stage to the input of a divider block and measuring or observing an output of the divider block with an oscilloscope.

* * * * *